SEMICONDUCTOR MICROWAVE OSCILLATOR

Filed Feb. 14, 1966

2 Sheets-Sheet 1

INVENTOR.
CHARLES MOSHER
BY John C Randa

Aug. 15, 1967 C. MOSHER 3,336,535

SEMICONDUCTOR MICROWAVE OSCILLATOR

Filed Feb. 14, 1966 2 Sheets-Sheet 2

INVENTOR.
CHARLES MOSHER

BY John c Ramda

United States Patent Office
3,336,535
Patented Aug. 15, 1967

3,336,535

SEMICONDUCTOR MICROWAVE OSCILLATOR

Charles Mosher, Los Altos, Calif., assignor to Varian Associates, Palo Alto, Calif., a corporation of California Filed Feb. 14, 1966, Ser. No. 527,351
8 Claims. (Cl. 331—107)

This invention relates in general to semiconductor microwave oscillator devices and more particularly to a semiconductor microwave oscillator incorporating a BNC semiconductor active element in conjunction with a stripline circuit environment.

In order to properly define the terminology BNC semiconductor diode or active element the following short description should suffice. The semiconductor has an n-type semiconductor body having a conduction band structure characterized by having satellite valleys which lie energetically higher than a central main valley with the satellite valleys further characterized by a lower mobility (higher effective mass) than the mobility (lower effective mass) associated with the central main valley and wherein the energy differential between the bottom of the satellite valleys and the bottom of the central main valley portions of the conduction band is smaller than the energy differential between the top of the valence band and the bottom of the central main valley of the conduction band and wherein the energy differential between the bottom of the satellite valleys and the bottom of the central main valley portion of the conduction band is greater than $$2kT$$

where $k$=Boltzmann constant
and $T$=absolute temperature in degrees Kelvin of the semiconductor body or (crystal temperature) as determined at the operating temperature of the semiconductor.

It has further been shown that such a semiconductor will when biased above $E_T$ in its negative differential mobility region (see FIG. 1) exhibit a conduction electron drift velocity $v$ versus electric field E dependence which contains a region of bulk negative differential mobility $$\mu=\frac{dv}{dE}<0$$

between $E_T$ and $E_v$. The values of $E_T$ and $E_v$ are measurable constants of the BNC material. It has also been shown that the BNC semiconductor denoted above has a critical $n_0w$ product which can be expressed as follows:

$$10^{12}/\text{cm.}^2<n_0w<10^{12}/\text{cm.}^2$$

where $n_0$=conduction electron number density for zero bias and at the operating temperature,
$w$=semiconductor body width between electrodes with $$n_0w>10^{12}/\text{cm.}^2$$

the BNC semiconductor diode will break into unstabilizable current oscillations when biased above $E_T$.

These oscillations are traveling space charge instabilities, the exact nature of which can take different forms. The two most interesting types are the dipole mode and the pure accumulation mode. Of course other types and variations are found but need not concern us here.

When $n_0w<10^{12}/\text{cm.}^2$, the BNC diode will exhibit a negative external conductance for applied frequencies above $f_T\approx10^7/w$. sec.$^{-1}$ where $w$ is in cm. and $f$ in Hz. the BNC diode will oscillate at a frequency which is determinable by the resonant circuit it sees to a greater extent than for BNC diodes with $n_0w>10^{12}/\text{cm.}^2$ when biased in its bulk negative differential mobility range. Therefore, the BNC diodes of the present invention include both the subcritically doped and the above critical types.

Attempts to produce watts of CW power and peak powers up to levels of hundreds of watts and above at microwave frequencies e.g., 0.5 gc.→100 gc. with semiconductor oscillators have heretofore gone unrealized. This invention through the utilization of a stripline circuit in conjunction with a semiconductor having a drift velocity vs. electric field dependence with a region of bulk negative differential mobility has resulted in the generation of microwave energy upon application of a suitable D.C. bias voltage to the bulk negative differential mobility semiconductor body. In order to generate appreciable powers using a bulk negative differential mobility semiconductor with good stability certain circuit characteristics will necessarily have to be observed and the present invention is germane to these criteria as exemplified in two specific stripline oscillator embodiments as will be set forth more clearly hereinafter. Basically the oscillators will include a stripline resonator section within which the BNC diode is disposed in a manner to optimize the transfer of microwave energy between the BNC diode and an external load while stabilizing the operating frequency of the oscillator. To obtain good power transfer and frequency stability the present invention provides means for facilitation of a stripline oscillator circuit in which the bulk negative differential mobility semiconductor hereinafter referred to as a BNC diode will oscillate for both $n_0w>10^{12}/\text{cm.}^2$ and $n_0w<10^{12}/\text{cm.}^2$ BNC diodes. The stripline oscillator will operate at frequencies $>\frac{1}{2}f_v$ where $f_v=v_v/w$ and is capable of being voltage tuned as well as being tuned by means of variation of the circuit parameters. The stripline oscillator circuit of the present invention should find extensive usage as a good relatively cheap source of microwave power as will be shown in more detail hereinafter.

The generic circuit concepts of the stripline oscillator of the present invention will include a stripline resonator section housing the BNC diode which is coupled to a BNC diode bias source via a low pass stripline filter circuit which includes shunt capacitor sections having an impedance which is low relative to other impedances in the oscillator circuit including the impedance of the BNC diode as well as the stripline resonator sections within which the BNC diode is disposed. The stripline oscillator will include output coupling means for extracting microwave energy in a manner which will not deleteriously affect the oscillator stability.

It is therefore an object of the present invention to provide a novel BNC diode stripline oscillator circuit.

Another object of the present invention is the provision of a tunable BNC diode stripline oscillator.

These and other features and advantages of the present invention will become more apparent upon perusal of the following specification taken in conjunction with the accompanying drawings wherein.

Figures 1, 3, 4:
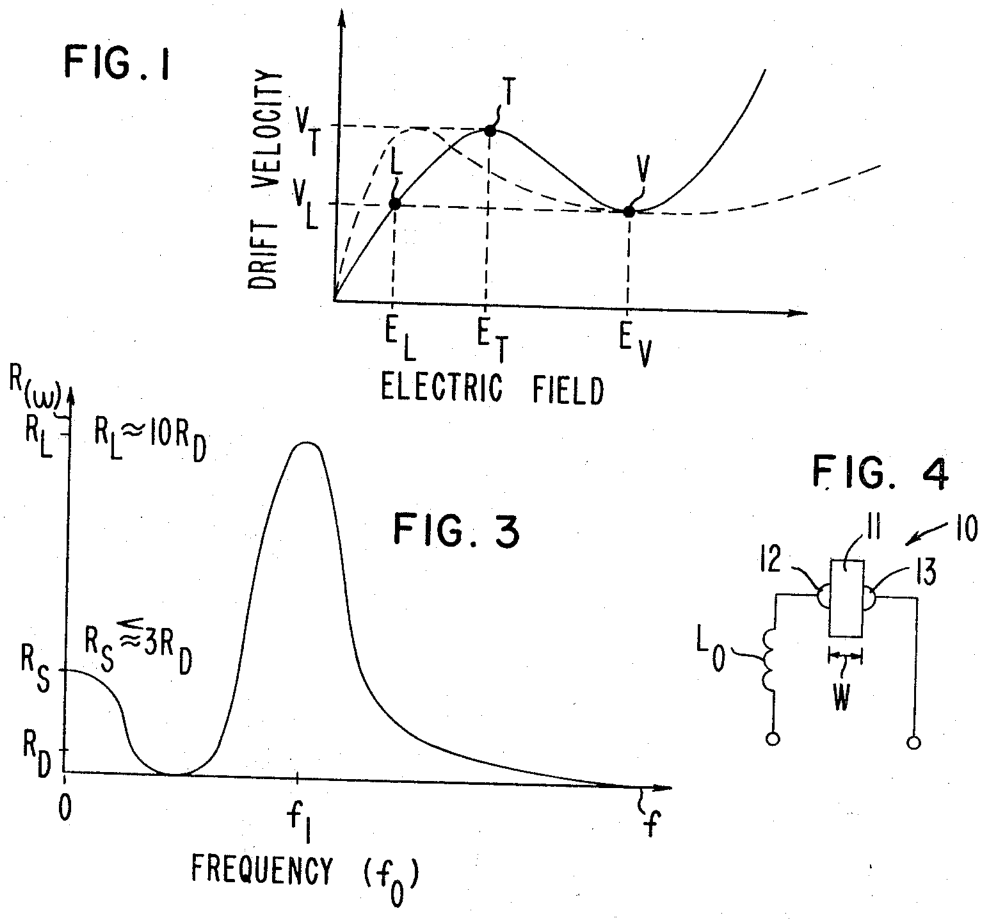
FIG 1 is an illustrative graphical portrayal of the drift velocity $v$ vs. electric field E dependence for a semiconductor containing a region of bulk negative differential mobility.
Figures 5, 6, 7, 8, 9:
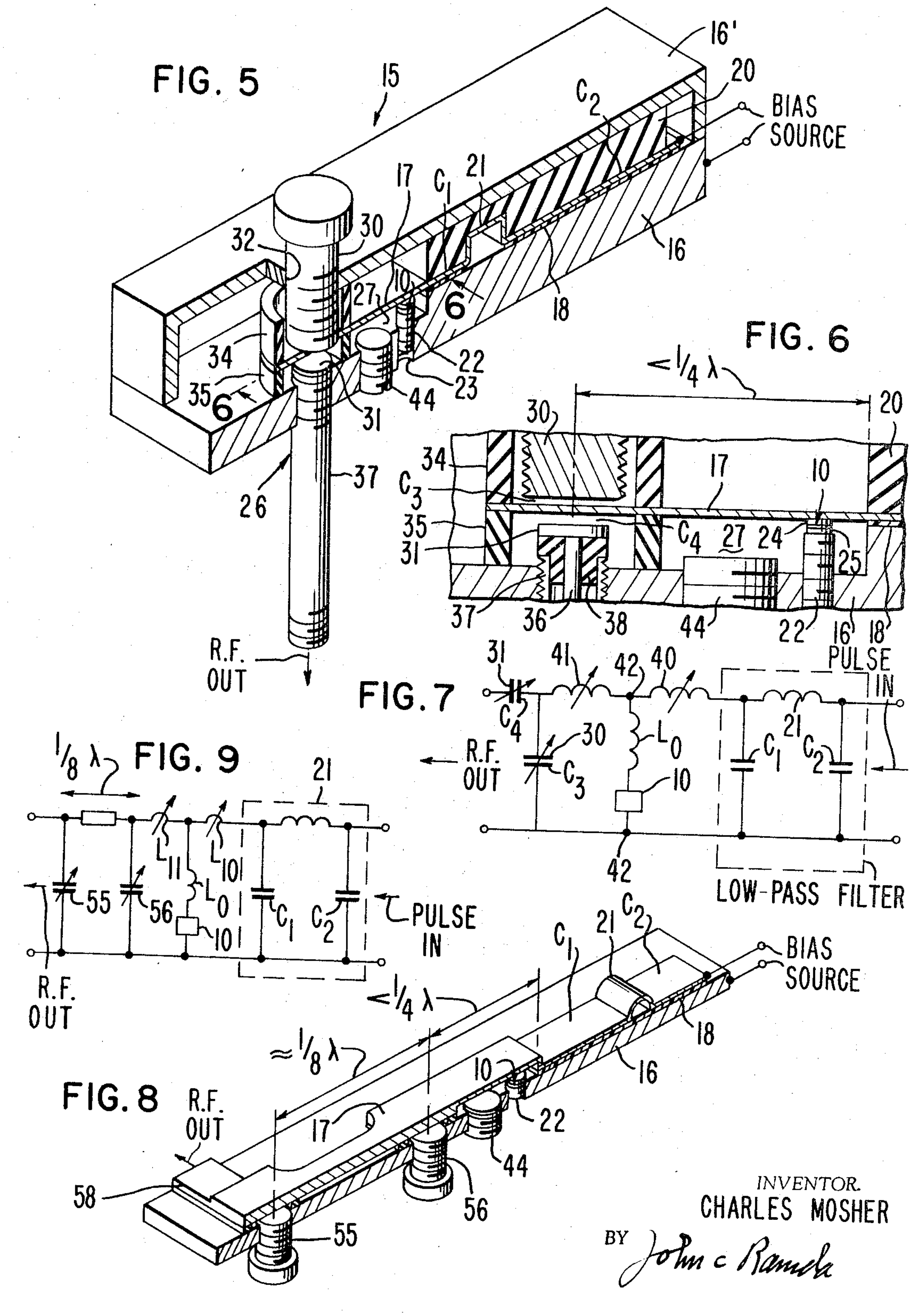

FIG. 3 is an illustrative graphical portrayal of the desired inter-relationship between the impedance levels seen by a two terminal BNC diode in an oscillator circuit environment as taught by the present invention, FIG. 4 is a schematic representation of a BNC diode including the parasitic inductance associated with the leads, FIG. 5 is a perspective view partially cut away of a specific stripline oscillator embodiment, FIG. 6 is an enlarged sectional view taken along the lines 6—6 in the direction of the arrows of the embodiment of FIG. 5, FIG. 7 is a schematic representation of the stripline oscillator embodiment of FIG. 5, FIG. 8 is a perspective view of an alternative embodiment of a stripline oscillator of the present invention, and FIG. 9 is a schematic representation of the stripline oscillator embodiment of FIG. 8.

Turning now to FIG. 1 there is depicted an illustrative graphical portrayal of the electron drift velocity $v$ vs. electric field E dependence of a typical BNC diode which is generic for $n_0w>10^{12}/\text{cm.}^2$ and $n_0w<10^{12}/\text{cm.}^2$. In other words, the bulk properties of BNC diodes have been shown to contain a region between $E_T$ and $E_v$ which is representative of a bulk negative differential mobility condition resulting from the band structure illustrated in FIG. 2 for n-type GaAs. A solid and a dotted curve are shown in FIG. 1 only to illustrate that the $E_T$ and $E_v$ values and curve shapes are dependent on the matreial used. In other words each material which has the band structure of the type depicted in FIG. 2 will have its own $v$ vs. E dependence. $E_T$ is representative of an absolute field value which is termed the threshold field value of any given BNC diode material where the differential mobility $$\mu=\frac{dv}{dE}\text{ turns negative}$$

This negative region extends to field values up to $E_v$, the exact values being a function of material parameters. $E_T$ generally speaking occurs for drift velocity values around $v_T=10^7$ cm./sec. Theoretical analysis has shown that BNC diodes having $n_0w>10^{12}/\text{cm.}^2$ will break into non-stabilizable current oscillations at microwave frequencies and that BNC diodes having $n_0w<10^{12}/\text{cm.}^2$ will exhibit a negative external conductance at microwave frequencies above a cross-over frequency. The present invention is directed to providing a stripline oscillator circuit useful with BNC diodes, regardless of $n_0w$.

Figure 2:
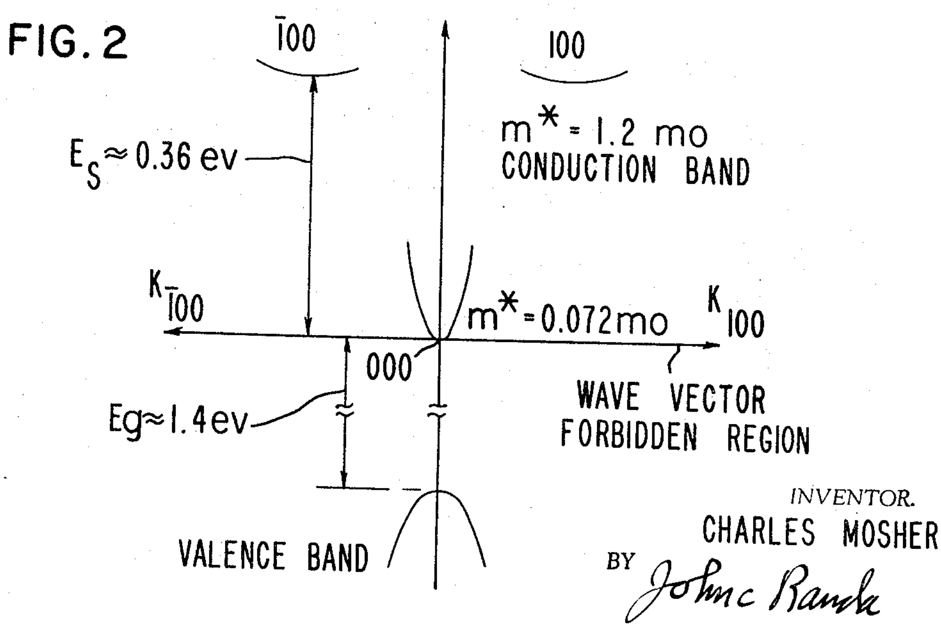
FIG. 2 is an illustrative graphical portrayal of the conduction band structure of a semiconductor material (n-type GaAs) which exhibits the desired region of bulk negative differential mobility.

It can be seen that GaAs possesses a many valley type of conduction band structure as depicted in the K-space illustrative portrayal of FIG. 2. See H Ehrenreich, "Band Structure and Electron Transport of GaAs," Phys. Rev., vol. 120, pp. 1951–1963; Dec. 1960, for more specific details. It has been determined that n-type semiconductors which possess this band structure will exhibit an electron drift velocity vs. electric field dependence which contains a region of bulk negative differential mobility as shown in FIG. 1. This phenomena is generic to many semiconductors, a few of which are, as determined by examination of their conduction band structures:

n-type GaAs
n-type InP
n-type CdTe
n-type$Ga(As_{(1-x)}P_{(x)})$
with $X<0.40$

The particular stripline oscillator of the present invention includes such a BNC diode. A particular example using n-type GaAs will suffice for purposes of illustration of a workable specific embodiment.

In brief then the bulk negative differential mobility region results from the presence of a conduction band structure wherein a main central valley lies energetically lower than satellite valleys with the satellite valleys characterized by having a higher effective mass (populated by electrons with low mobility) than the central main valley which is characterized by having a low effective mass (populated by electrons with high mobility) with the energy differential between the bottom of the satellite valleys and the bottom of the central main valley portions of the conduction band being smaller than the energy differential between the top of the valence band and the bottom of the central main valley portion of the conduction band. In operation the energy differential between the bottom of the satellite valley and the bottom of the central main valley portions of the conduction band shall be greater than at least 2 $k$T where $k$=Boltzmann constant and T=absolute temperature in ° Kelvin of the semiconductor body (crystal temperature) at the operating temperature of the device.

With the above generic relationships a region of bulk negative differential mobility will occur in a BNC semiconductor.

The BNC diode stripline oscillators of the present invention will operate at frequencies above $f>\frac{1}{2}f_v$ where $$f_v=v_v/w$$

and will in a proper overall circuit environment be capable of voltage tuning as well as circuit tuning by variation of the stripline circuit parameters. It has been determined that the operating frequency of the BNC diode stripline oscillators of the present invention will be primarily a function of the stripline oscillator circuit parameters. Good stability and power output can be achieved by providing an oscillator circuit which presents an impedance vs. frequency characteristic the real part of which is shown in FIG. 3 to the BNC diode. The oscillator circuit as can be seen upon examination of FIG. 3 will present a resistance $R_s$ to the BNC diode terminals looking towards the source end such that the BNC diode sees an $R_s$ which is $>R_D$ for D.C. levels and which is infinite or as high as possible at the operating frequency $f_1$. The BNC diode will see an $R_L$ looking towards the load which is infinite or as high as possible at D.C. and which is $>R_D$ at the operating frequency $f_1$. The preferred levels are $R_L\approx 10\ R_D$ at $f_1$ and $R_s \lesssim 3\ R_D$ for D.C. bias conditions. The resistance at other frequencies is determined by the physically realizable nature of the circuit, and is affected by the design compromise made between conversion efficiency and output spectrum. The particular stripline oscillator circuit embodied in FIGS. 5 and 8 have been found to be good physical realizations of the conditions shown in FIG. 3 as will be set forth in more detail hereinafter.

In FIG. 4 a schematic representation of a BNC diode is depicted which includes the parasitic inductance $L_0$ associated with the inevitable terminal leads at the source and drain electrodes. The BNC diode 10 includes a body of semiconductor material 11 which exhibits a bulk negative differential mobility disposed between a pair of source and drain electrodes 12, 13. The diode width $w$ is measured as the distance between the electrodes 12, 13. The parasitic inductance associated with any leads attached to the source and drain electrodes, which includes the inductance associated with the electrodes themselves is denoted by $L_0$.

In order to minimize the damage done to the device by switching transients the following relations between $R_D$ and $L_0$ should be observed $$\frac{f_0L_0}{R_D}<1$$

where $$f_0=\frac{v_T}{w}$$

$w$=diode body width between source and drain electrodes
$V_T\approx 10^7$ cm/sec.
$R_D$=diode resistance at thermal equilibrium
$L_0$=parastic inductance The above indicates that $L_0$ should be maintained at as low a level as possible as determined by the particular circuit environment.

Turning now to FIG. 5 a BNC diode stripline oscillator 15 which incorporates the teachings of the present invention is shown. The stripline oscillator 15 includes a first stripline ground plane 16 of any suitable metal e.g. copper. A reduced width second stripline conductor 17 which is spaced therefrom with an insulator strip 18 of e.g. Mylar. The oscillator 15 includes a suitable housing cover member 16' which is secured to the ground plane 16 and thus forming part of the ground plane by any suitable means e.g. brazing to complete a compact circuit structure. A block 20 of e.g. Mylar or any other conventional low-loss dielectric insulator is disposed between the stripline conductor 17 and the top of the housing 16' to prevent any relative movement of the various circuit elements. The strip conductor 17 is provided with an inductive perturbation, enlarged height portion 21, which in conjunction with capacitor sections $C_1$, $C_2$ and ground plane 16 forms a low pass filter. The BNC diode 10 is mounted on a conductive screw 22 made from copper which is rotatably supported in a threaded apertures 23 through the ground plane 16 as shown. A good press fit is then obtained between the strip conductor 17 and ground plane 16 and the source and drain electrodes 24, 25 by simple rotation of mounting screw 22 to which the electrode 24 is brazed to as best seen in enlarged FIG. 6. The stripline mode of interest is propagated between condutcors 17 and 16 and microwave (R.F.) energy is extracted via coaxial output 26. The strip conductor 17 can be tapered to manipulate its impedance properties. The BNC diode 10 which includes source and drain electrodes 24, 25 is disposed in a stripline resonator portion 27 of the oscillator 15. The resonant frequency of the oscillator is controllable by variation of the capacitor tuning members 30, 31. Tuning member 30 is a screw which is rotatably mounted in threaded aperture 32 in ground plane cover 16'. By simply increasing the depth of penetration of screw 30 towards strip conductor 17 the lumped shunt capacitance denoted $C_3$ in FIG. 7 between the end or tip portion of screw 30 and strip conductor 17 can be increased and vice-versa. Similarly by variation of rotatable coaxial output conductor 26 the distance between metal end cap 31 and line 17 can also be varied to control the lumped series capacitance represented by $C_4$ in the schematic circuit of FIG. 7. A pair of dielectric tubular spacers, 34, 35 e.g. Telfon insulation are used to securely support the R.F. output end portion of strip conductor 17 between the cover and ground plane as shown. The R.F. output coaxial conductor 26 includes inner conductor 36 which is centered within outer conductor 37 at the coupling end by dielectric plug 38 as shown in FIG. 6. An enlarged end cap 31 terminates the inner conductor to form the movable portion of capacitor $C_4$ as best seen in FIG. 6.

Examination of the schematic circuit diagram of FIG. 7 shows that inductive perturbation 21 forms the series inductor portion of the low pas filter with the shunt capacitors formed by $C_1$, $C_2$. The stripline circuit lengths on either of BNC diode 10 are schematically represented by inductors 40, 41 and the lumped tuning capacitors $C_3$, $C_4$ are as previously indicated. A correlation between FIGS. 3 and 7 shows that the BNC diode terminals 42 will indeed see an $R_S$ at D.C. which is slightly greater than $R_D$, the exact values of which are a matter of empirical design depending on the desired operating parameters etc., and an extremely high impedance at the operating frequency $f_1$. Similarly the BNC diode terminals 42 looking towards the R.F. output end of the oscillator see an extremely large $R_L$ at D.C. and low frequencies and a $R_L$ which is greater than $R_D$ and $R_S$ (at D.C. level) at the operating frequency $f_1$.

The characteristic impedances of the striplines comprising of $C_1$ and $C_2$ are chosen to be very low at $f_1$ so that their transverse width dimensions can be made small enough for the desired lumped capacitance levels of $C_1$, $C_2$ to move the transverse mode resonant frequencies above the operating frequency $f_1$ to minimize coupling to any transverse modes. Similarly the characteristic impedance level of the series inductance 21 is made larger than the characteristic impedances of $C_1$, $C_2$ at $f_1$ to minimize the inductor portion length and thus minimize coupling to longitudinal resonances at the operating frequency $f_1$. The characteristic impedance of the stripline resonator portion 27 is chosen as a design compromise between optimizing the output spectrum, rise time, power conversion efficiency etc. Good results have been obtained with characteristic impedance levels chosen higher than the impedance levels of $C_1$ and $C_2$ at $f_1$.

The electrical length of the stripline section 37 within which the BNC diode 10 is disposed between $C_1$ and 30, 31 is chosen to be $<\frac{1}{4}\lambda$ at $f_1$ and preferably much shorter to minimize spurious mode problems. Good results have been obtained with length of $\frac{1}{20}\lambda$ at $f_1$. The stripline oscillator is capable of being tuned by variation of circuit parameters and/or bias voltage.

The bias voltage source which can be pulsed or C.W. is supplied from any known type of supply e.g. battery, pulse generator etc. Inductive tuning can be accomplished by means of tuning screw 44 disposed in the stripline section 27 by perturbing the magnetic field lines. Capacitive tuning can be accomplished by variation of tuning capacitor screw 30. The variable inductor tuner screw 44 is indicated in the schematic of FIG. 7 by the arrows on 40, 41. The coupling capacitor 31 can be varied to control the output coupling and thus the resistive part of the load impedance presented to the BNC diode and will also result in variation of $f_1$.

In FIG. 8 and accompanying schematic representation of FIG. 9 a variation in the R.F. output coupling scheme is depicted. A short length of stripline of about $\frac{1}{8}\lambda$ at $f_1$ as indicated is disposed between the two variable capacitors 55, 56. The characteristic impedance of this section is chosen higher than the device resistance and serves as a rough loading adjustment and the exact value is again a circuit design choice. Good results were obtained with approximately 20 ohm sections with device resistances of 1 ohm. Variation of capacitor screw 56 provides good tuning without greatly affecting the output coupling impedance level and variation of tuning capacitor screw 55 within moderate ranges provides a simple means for varying the resistive part of the impedance presented to the load while not perturbing the operating frequency as much as variation of tuning capacitor 31 in the FIG. 5 embodiment does.

The circuit of FIG. 8 also includes the inductive tuning means and low pass filter sections as previously discussed in connection with the FIG. 5 embodiment. The R.F. output is extracted from stripline section 58 which is chosen higher than $R_D$ and serves as a transition to a load coupler. Good results have been obtained with 50 ohm sections in conjunction with 1 ohm for the device.

Good tuning of stripline oscillators as shown in FIGS. 5–9 over frequencies ranging over .7 to 6.5 gc. using 1 sq. millimeter BNC diodes of n-type GaAs having thicknesses between 80 to 100 microns around 1 ohm-cm. nominal resistivities with source and drain electrodes made of alloyed tin contacts or electrodless nickel covered with tin was achieved. It is to be noted that the source and drain electrodes can obviously take other forms than the indicated alloyed metal contacts. The bias source was a pulse generator with pulse lengths of 150 nanosecond or 300 nanoseconds with rise and fall times between 50 and 40 nanoseconds. Bias voltage variations between 40 and 65 volts produced peak powers up to 60 watts and parallel operation of a pair of BNC diodes at 86 volts in the FIG. 5 embodiment produced over 200 watts peak power with efficiencies over 5%. The above BNC diodes were of the $n_0w > 10^{12}/\text{cm.}^2$ type. Circuit considerations for BNC diodes with $n_0w < 10^{12}/\text{cm.}^2$ are similar, the main difference being the requirement that the conductance of the BNC diode plus the conductance of the load it sees $<_0$ for oscillation to occur at operating frequencies in the external negative conductance region above the crossover frequency which will be around $10^7$ cm./sec./w.

The operating frequency for any given case will of course be dependent on numerous parameters. The example, if BNC diodes with $n_0w > 10^{12}$/cm.$^2$ are used, the most useful modes of operation would be a dipole mode and a pure accumulation mode. In the dipole mode situation the natural frequency of the BNC diode would be approximately $$f \approx \frac{{}^vL}{w}$$

and in the pure accumulation mode case the natural frequency would be around and above $f \approx {}^vT/w$ as with $n_0w < 10^{12}$/cm.$^2$. In these latter cases the natural frequency will be more dependent on the resonant circuit parameters seen by the BNC terminals. In any case the stripline oscillators of the present invention will be voltage and circuit tunable over wide ranges because of the high dependence of the BNC diode operating frequency on the circuit environment.

It is to be noted that the stripline oscillator circuit of the present invention is usable with BNC diodes which fall within the confines of the generic band structure requirements set forth previously and which are termed for purposes of definition semiconductors having an electron drift velocity $v$ vs. electric field E dependence which contains a region of bulk negative differential mobility.

Since many changes could be made in the above construction and many apparently widely different embodiments of this invention could be made without departing from the scope thereof it is intended that all matter contained in the above description or shown in the accompanying drawings shall be interpreted as illustrative and not in a limiting sense.

What is claimed is:

1. A semiconductor stripline oscillator circuit operable at microwave frequencies comprising at least a pair of spaced stripline conductors, said stripline conductors forming a low pass filter means at one end portion of said oscillator, said one end portion including means for applying a bias voltage to said one end portion of said oscillator circuit, said low pass filter means being adapted and arranged to pass D.C. while blocking R.F. energy at $f_1$, where $f_1$ is the oscillator circuit operating frequency a semiconductor diode disposed within said oscillator between said pair of stripline conductors, said semiconductor diode being of a type which exhibits an electron drift velocity $v$ vs. applied electric field E dependence which contains a region of bulk negative differential mobility, said diode body being disposed between a pair of source and drain electrodes, said source and drain electrodes being in D.C. coupling relationship with respect to said pair of stripline conductors, said semiconductor diode being disposed in a section of stripline which is bounded on the bias source end by said low-pass filter means and on the R.F. output end by a lumped shunt capacitance, said oscillator including means for extracting R.F. energy from said stripline oscillator.

2. The stripline oscillator circuit defined in claim 1 where said low pass filter means includes an inductive perturbation in at least one of said strip conductors.

3. The oscillator circuit defined in claim 1 wherein said stripline oscillator circuit includes means for varying the operating frequency $f_1$, said means for varying the operating frequency including at least one tunable shunt capacitor means incorporated in said oscillator.

4. The oscillator circuit defined in claim 1 wherein said stripline oscillator circuit includes means for varying the operating frequency $f_1$, said means for varying the operating frequency including at least one tunable series inductor means incorporated in said oscillator.

5. A stripline oscillator circuit including a ground plane having a first width dimension, a strip conductor mounted on said ground plane and spaced therefrom and having a width dimension less than said first width dimension, low pass filter means disposed at the one end portion of said oscillator circuit, means for coupling a pulsed D.C. bias source voltage between said ground plane and said spaced strip conductor, a semiconductor diode having a drift velocity $v$ vs. electric field E dependence with a region of bulk negative differential mobility disposed within said oscillator and in D.C. coupling relationship between said ground plane and said spaced strip conductor, lumped shunt capacitance means disposed in said oscillator between said ground plane and said stripline, said semiconductor diode being disposed in a stripline section of said oscillator which has an electrical length which is less than ¼λ, where λ is determined at any frequency within the operating range of the oscillator and where λ is measured between said low pass filter section and said lumped capacitance means, and means for extracting R.F. energy from said oscillator circuit.

6. The oscillator defined in claim 5 wherein said low pass filter includes a pair of shunt capacitor means disposed on opposite sides of an inductive perturbation, with the characteristic impedance values of each of said shunt capacitor means being less than the impedance level of said semiconductor diode as determined at the operating frequency of said oscillator circuit.

7. The oscillator defined in claim 5 wherein said oscillator includes inductive tuning means disposed in said less than ¼λ stripline section, for varying the operating frequency of said oscillator.

8. The oscillator defined in claim 5 wherein said oscillator includes an approximately ⅛λ stripline section, where λ is determined at the operating frequency, disposed at the R.F. output end portion of said oscillator, said ⅛λ stripline section being disposed between a pair of lumped tunable shunt capacitances disposed between said ground plane and said spaced strip line conductor.

References Cited

UNITED STATES PATENTS

| | | | |
|---|---|---|---|
| 3,213,389 | 10/1965 | Campi et al. | 331—99 |
| 3,237,122 | 2/1966 | Campi | 331—99 |
| 3,246,256 | 4/1966 | Sommers | 331—107 |

OTHER REFERENCES

Nelson et al.: Proc. of the IRE, "A Five-Watt Ten-Megacycle Transistor," pages 1209–1215, June 1958.

ROY LAKE, *Primary Examiner.*

J. KOMINSKI, *Assistant Examiner.*